United States Patent
Guo

(10) Patent No.: US 11,047,931 B2
(45) Date of Patent: Jun. 29, 2021

(54) MAGNETIC FIELD SENSOR ARRAY WITH ELECTROMAGNETIC INTERFERENCE CANCELLATION

(71) Applicant: Apple Inc., Cupertino, CA (US)

(72) Inventor: Jian Guo, Milpitas, CA (US)

(73) Assignee: Apple Inc., Cupertino, CA (US)

(*) Notice: Subject to any disclaimer, the term of this patent is extended or adjusted under 35 U.S.C. 154(b) by 47 days.

(21) Appl. No.: 15/485,137

(22) Filed: Apr. 11, 2017

(65) Prior Publication Data

US 2018/0292468 A1    Oct. 11, 2018

(51) Int. Cl.
| | |
|---|---|
| *G01R 33/34* | (2006.01) |
| *G01R 33/3415* | (2006.01) |
| *G01R 33/565* | (2006.01) |
| *G01R 33/02* | (2006.01) |
| *G01R 33/38* | (2006.01) |
| *G01R 33/00* | (2006.01) |
| *G01R 33/07* | (2006.01) |

(52) U.S. Cl.
CPC ......... *G01R 33/0029* (2013.01); *G01R 33/07* (2013.01)

(58) Field of Classification Search
CPC ............... G01R 33/0035; G01R 33/00; G01R 33/0029; G01R 33/022; G01R 33/07; G01R 33/10; G01R 33/3875; G01R 33/5659; G01R 33/341; G01R 33/3453; G01R 33/3642; G01R 33/3657; G01R 33/3415

See application file for complete search history.

(56) References Cited

U.S. PATENT DOCUMENTS

| | | | | |
|---|---|---|---|---|
| 4,733,179 | A * | 3/1988 | Bauer | G01C 17/38 324/244 |
| 6,717,485 | B2 * | 4/2004 | Kolb | H04B 15/02 174/250 |
| 7,164,950 | B2 * | 1/2007 | Kroll | A61N 1/368 607/36 |
| 7,725,079 | B2 | 5/2010 | Kim et al. | |
| 9,294,202 | B1 | 3/2016 | Wietfeldt et al. | |
| 9,366,537 | B2 * | 6/2016 | Bugno | G01C 17/38 |
| 2004/0088012 | A1 * | 5/2004 | Kroll | A61N 1/3718 607/9 |
| 2010/0102809 | A1 * | 4/2010 | May | G01R 33/022 324/244 |

(Continued)

OTHER PUBLICATIONS

The Measurement Method of 2D Distribution of EMI in the on-Chip Power Distribution Network, IEEE International Conference on Integrated Circuits and Microsystems, 2016.*

(Continued)

*Primary Examiner* — Alesa Allgood
(74) *Attorney, Agent, or Firm* — Fish & Richardson P.C.

(57) ABSTRACT

Systems, methods and non-transitory, computer-readable mediums are disclosed for a magnetic field sensor array with electromagnetic interference cancellation. In an embodiment, a circuit comprises: a first circuit configured for obtaining an output signal from a magnetic field sensor array in an electronic system, the output signal representing a magnetic field present in the electronic system, the magnetic field including electromagnetic interference (EMI) generated by one or more magnetic aggressors of the electronic system; and a second circuit configured to apply one or more magnetic field gradient heat maps to the output signal.

17 Claims, 5 Drawing Sheets

(56) References Cited

U.S. PATENT DOCUMENTS

2013/0146275 A1*  6/2013  Sato ........................ G06F 1/206
                                                                  165/289
2016/0087379 A1*  3/2016  Tanaka ................... H01R 12/79
                                                                  439/607.01
2016/0232394 A1*  8/2016  Riedijk ................... G06F 3/044

OTHER PUBLICATIONS

Chung et al., "A Passive Very Low-Frequency (VLF) Electric Field Imager," IEEE Sensors Journal, May 1, 2016, 7 pages.
Wang et al., "The Measurement Method of 2D Distribution of EMI in the on-Chip Power Distribution Network," IEEE International Conference on Integrated Circuits and Microsystems, 2016, 6 pages.

* cited by examiner

MAGNETIC FIELD SENSOR ARRAY WITH ELECTROMAGNETIC INTERFERENCE CANCELLATION

TECHNICAL FIELD

This disclosure relates generally to magnetic field sensor technology.

BACKGROUND

Electromagnetic Interference (EMI) affects an electronic system by electromagnetic induction, electrostatic coupling or conduction. EMI can be problematic in, for example, electronic systems that include several EMI sources integrated within the same housing as a digital magnetic compass. FIG. 1 illustrates a digital magnetic compass application displayed on a touchscreen of a smartphone, and FIG. 2 illustrates a typical earth magnetic field, which ranges between 25 µT~62 µT, depending on the geographical location.

To maintain an acceptable heading error (e.g., <30° heading error) for the magnetic compass typically requires EMI to be in the range of a few µT. In some electronic systems having a small form factor (e.g., a smartphone), a magnetometer sensor package may be located close (e.g., several millimeters) to one or more EMI sources (e.g., a speaker voice coil, camera, CPU, haptic engine, battery). The EMI is frequency dependent and can have an amplitude as high as a few mT. This large EMI could result in a large magnetic compass heading error (e.g., up to 90° heading error), impacting the performance of applications, such as the compass application shown in FIG. 1 and other applications (e.g., gaming and navigation applications), that use multi-axis magnetometers to determine direction or compensate for errors in other sensors (e.g., compensate gyro sensors).

SUMMARY

Systems, methods and non-transitory, computer-readable mediums are disclosed for a magnetic field sensor array with EMI cancellation.

In an embodiment, a circuit comprises: a first circuit configured for obtaining an output signal from a magnetic field sensor array in an electronic system, the output signal representing a magnetic field present in the electronic system, the magnetic field including electromagnetic interference (EMI) generated by one or more magnetic aggressors of the electronic system; and a second circuit configured to apply one or more magnetic field gradient heat maps to the output signal.

In an embodiment, a method comprises: obtaining, by an electronic system, an output signal from a magnetic field sensor array in the electronic system, the output signal representing a magnetic field present in the electronic system, the magnetic field including electromagnetic interference (EMI) generated by one or more magnetic aggressors of the electronic system; determining, by the electronic system, one or more magnetic aggressors that are active in the electronic system; obtaining, from a storage device of the electronic system, one or more magnetic field gradient heat maps generated by the one or more active magnetic aggressors; and applying the one or more magnetic field gradient heat maps to the output signal to cancel EMI contributions to the output signal generated by the one or more active magnetic aggressors.

In an embodiment, an electronic system comprises: a magnetic sensor array; selection circuitry coupled to the sensor array; a storage device configured for storing calibrated magnetic field gradient heat maps generated by a plurality of magnetic aggressors in the electronic system; one or more processors; memory storing instructions, which when executed by the one or more processors, cause the one or more processors to perform operations comprising: obtaining, by the selection circuitry, an output signal from the magnetic field sensor array in the electronic system, the output signal representing a magnetic field present in the electronic system, the magnetic field including electromagnetic interference (EMI) generated by one or more magnetic aggressors of the electronic system; determining one or more magnetic aggressors that are active in the electronic system; obtaining, from a storage device, one or more magnetic field gradient heat maps generated by the one or more active magnetic aggressors; and applying the one or more magnetic field gradient heat maps to the output signal to cancel EMI contributions to the output signal generated by the active one or more magnetic aggressors.

In an embodiment, a non-transitory, computer-readable storage medium includes instructions, which, when executed by one or more processors, causes the one or more processors to perform operations comprising: obtaining an output signal from a magnetic field sensor array in an electronic system, the output signal representing a magnetic field present in the electronic system, the magnetic field including electromagnetic interference (EMI) generated by one or more magnetic aggressors of the electronic system; determining one or more magnetic aggressors that are active in the electronic system; obtaining one or more magnetic field gradient heat maps generated by the one or more active magnetic aggressors; and applying the one or more magnetic field gradient heat maps to the output signal to cancel EMI contributions to the output signal generated by the one or more active magnetic aggressors.

Particular implementations disclosed herein provide one or more of the following advantages. The disclosed magnetic sensor array with background noise cancellation allows the generation of high spatial resolution, magnetic field gradient heat maps for multiple magnetic aggressors in an electronic system. The magnetic gradient heat maps can be used to cancel background magnetic interference/noise from magnetic sensor measurements used for applications that require accurate earth magnetic field measurements, such as digital magnetic compass applications.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

The disclosed embodiments include a magnetic field sensor array (hereinafter "sensor array") that generates one or more system level magnetic field gradient heat maps for one or more magnetic aggressors with high spatial resolution. A calibration procedure generates and stores magnetic field gradient heat maps for each magnetic aggressor in an electronic system. The magnetic gradient heat maps are used to cancel EMI included in the output of the sensor array. In an example embodiment, the sensor array includes a row selector that individually addresses magnetic field sensing elements in the sensor array (hereinafter "sensing elements"). The architecture also includes column circuitry for column parallel readout and signal conditioning (e.g., amplification, analog-to-digital conversion (ADC), filtering) of sensing element output signals. In an embodiment, the column circuitry includes a chopper stabilized (auto-zero) amplifier, (ADC) and a digital filter (e.g., a digital low-pass filter) for low noise readout. Each sensing element detects both the earth magnetic field and EMI generated by one or more magnetic aggressors. By subtracting the EMI from the output of the sensor array, the earth magnetic field can be obtained with high accuracy.

Example System

Figure 2:
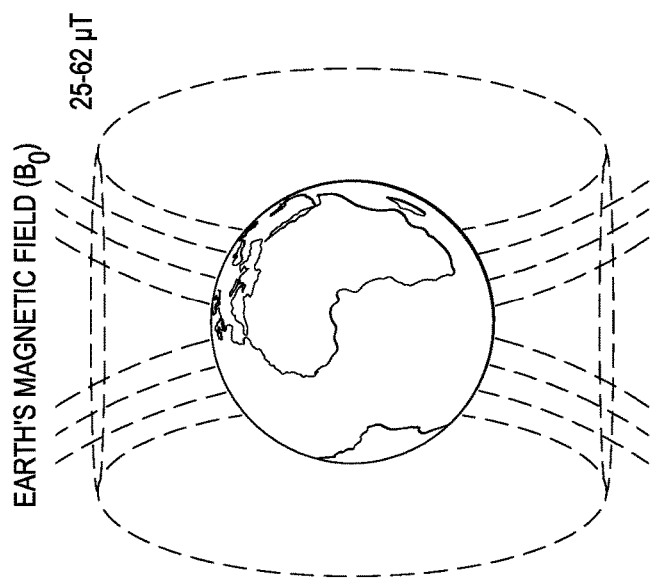
FIG. 2 illustrates Earth's magnetic field.
Figure 1:
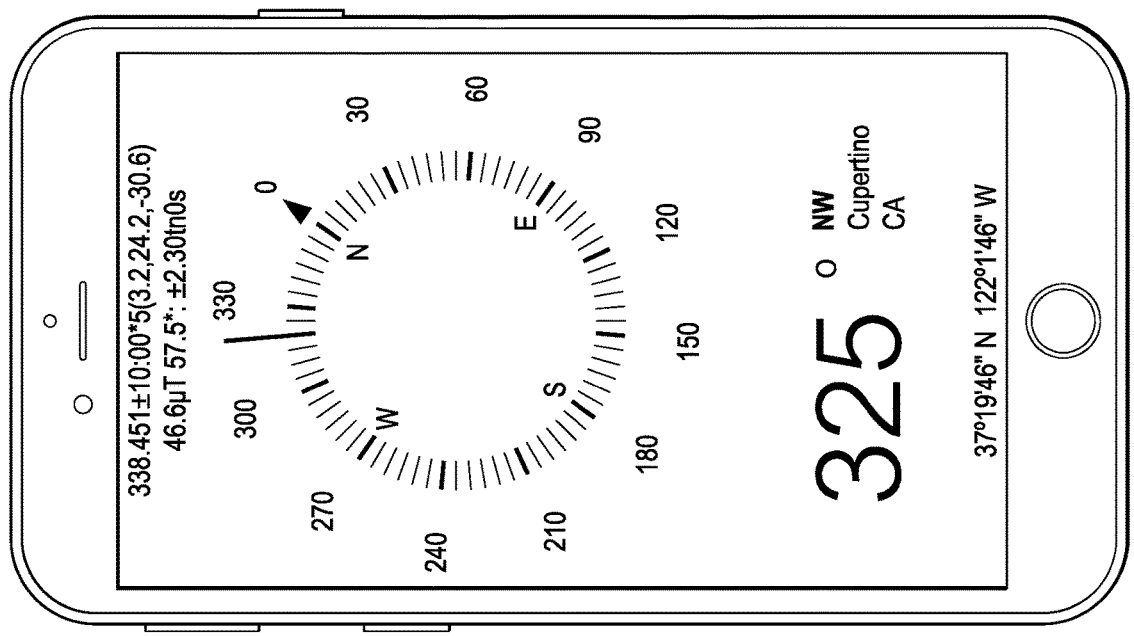
FIG. 1 illustrates a digital magnetic compass application running on a mobile device, according to an embodiment
Figure 3:
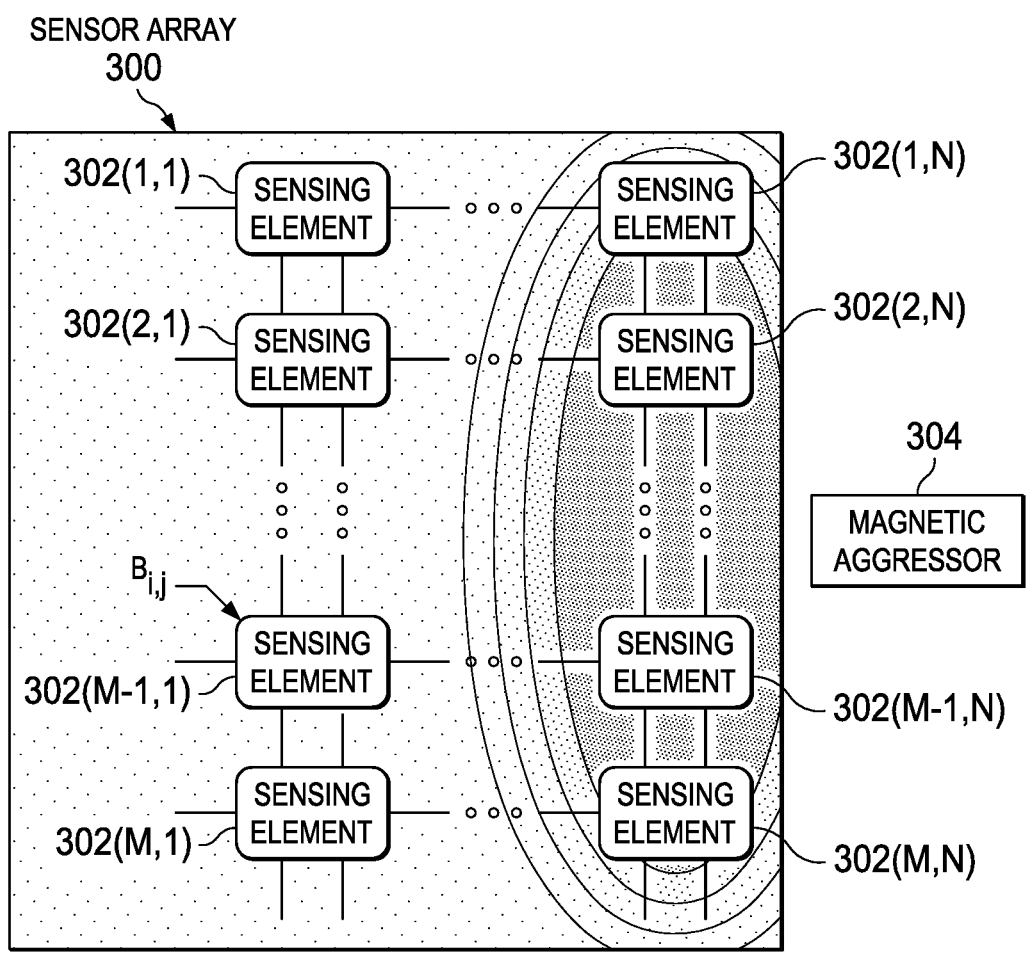
FIG. 3 illustrates an example sensor array, according to an embodiment.

FIG. 3 illustrates an example a sensor array, according to an embodiment. Sensor array 300 includes a plurality of sensing elements 302(i, j) arranged in a two-dimensional (2D) grid pattern having M rows and N columns. Sensing elements 302(i, j), however, need not be arranged in a 2D grid pattern. For example, two or more sensing elements can be positioned at any location in an electronic system (e.g., a smart phone, tablet computer, wearable computer, vehicle navigation system) and arranged in any desired pattern. The placement of sensing elements 302 in an electronic system may be determined at least in part by a circuit board layout or other physical constraint. In an embodiment, multiple sensor arrays can be placed at any suitable location in an electronic system, and can be dedicated to a particular magnetic aggressor. In an embodiment, sensor array 300 can be placed in a 2D plane of a printed circuit board or in a layer of a display device of the electronic system (e.g., in a layer of a touch sensitive screen).

Each sensing element 302(i,j) senses a magnetic field, B (i, j), and outputs a signal representative of B (i, j), where i and j are positive integer values that represent the position of the sensing element 302(i,j) in sensor array 300. For example, B (0,0) would be the magnetic field sensed by sensing element 302 (0,0) and B (2, 1) would be the magnetic field sensed by sensing element 302 (2,1) and so forth. In an embodiment, sensor array 300 can be placed adjacent to, or surround, a magnetic aggressor. In an embodiment, sensing elements 302(i,j) can be arranged in a three-dimensional configuration. Any number of sensor arrays can be included in an electronic system, including one or more sensor arrays for each magnetic aggressor.

A magnetic aggressor can be any component internal to the electronic system (e.g., a smartphone) that emits EMI, including but not limited to a speaker voice coil, camera, central processing unit (CPU), haptic engine and a battery. A shown in FIG. 3, sensing elements 302(i,j) are subjected to EMI generated by magnetic aggressor 304 inside the electronic system. The closer a sensing element 302(i,j) is to the magnetic aggressor 304 the stronger the EMI sensed by the sensing element 302. For example, element 302 (2, N) would sense a stronger EMI than sensing element 302 (2, 1).

By sensing the magnetic field gradient over an area (as opposed to a single location) in the electronic system, the magnetic field within the electronic system can be reconstructed with high spatial accuracy. A more accurate reconstruction of the magnetic field gradient within the electronic system allows for improved cancellation of EMI, and is particularly advantageous for electronic systems that include multiple magnetic aggressors that can operate at the same time or different times, and therefore cause the magnetic field within the electronic system to vary according to which magnetic aggressors are active when the sensor array is scanned.

Figure 4A:
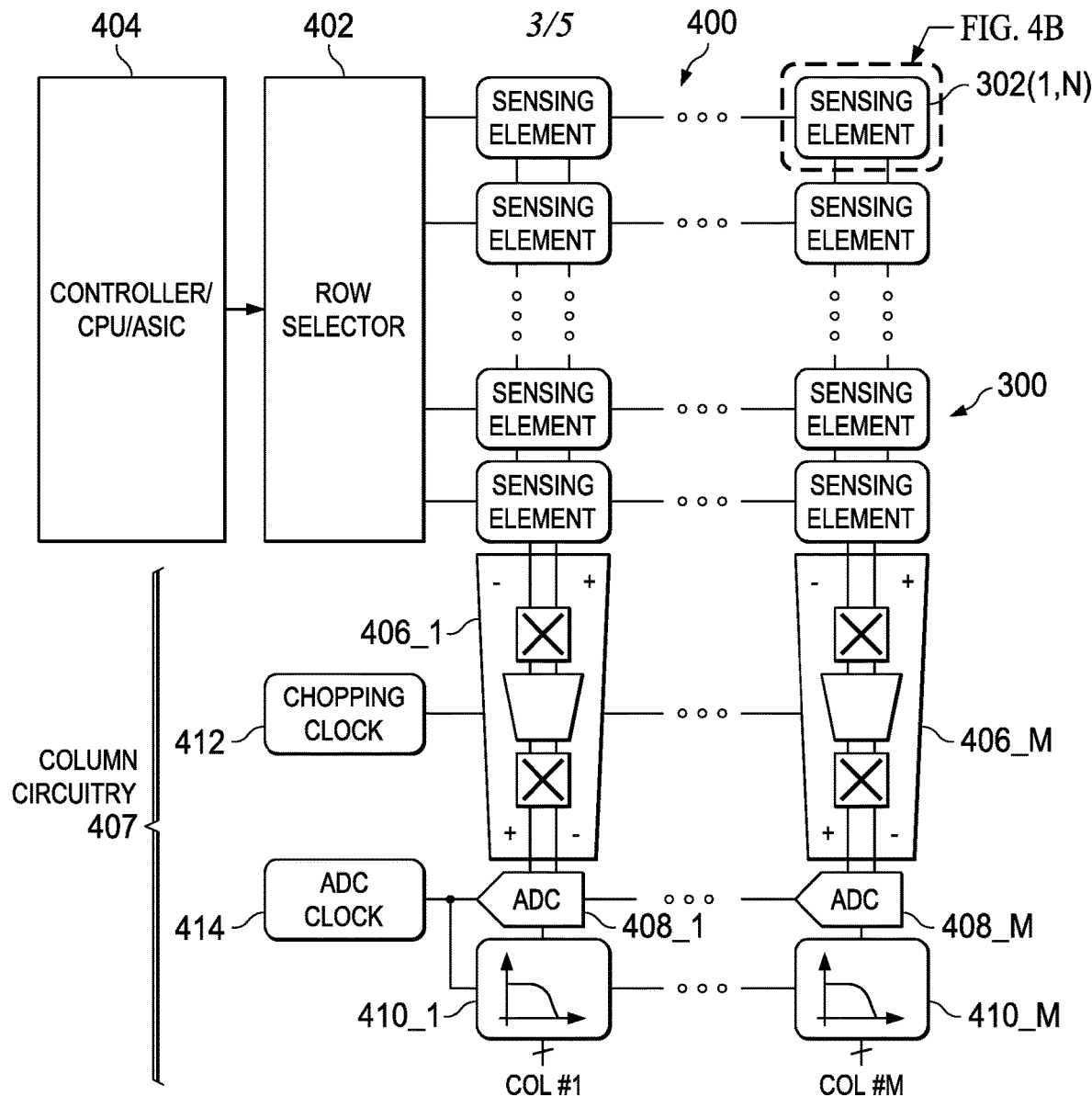
FIG. 4A is schematic diagram of an example magnetic sensor array architecture, according to an embodiment.

FIG. 4A is schematic diagram of an example sensor array system 400, according to an embodiment. System 400 includes sensor array 300, row selector 402 and column circuitry 407. Sensor array 300 includes M rows and N columns of sensing elements 302, as described in reference to FIG. 3. Column circuitry 407 is coupled to the output of each column of sensor array 300. In an embodiment, column circuity 407 includes amplifier 406, ADC 408 and digital filter 410 coupled in series.

Figure 4B:
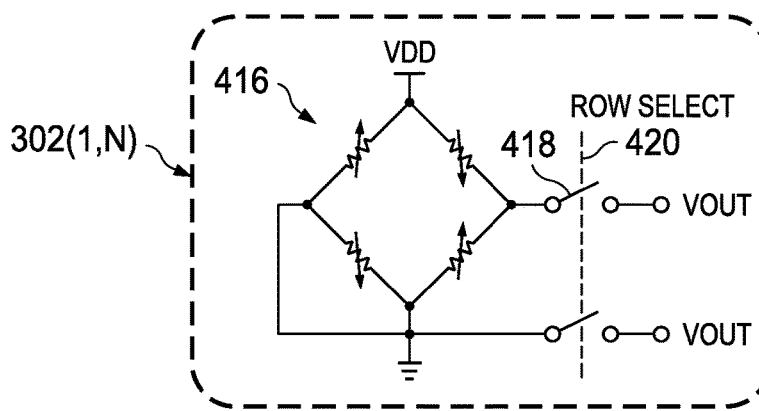
FIG. 4B is a schematic diagram of an example sensing element of the magnetic sensor array architecture of FIG. 4A, according to an embodiment.

The voltage output ($V_{OUT}$) of each sensing element 302 is controlled by selection signal 420 provided by row selector 402, as shown in FIG. 4B. Row selector 402 includes circuitry for generating selection signals for individually addressing sensing elements 302 of sensor array 300 for readout. Selection logic 404 includes logic for determining which sensing element 302 to select for readout. In an embodiment, selection logic 404 can be a measurement controller, CPU or application specific integrated circuit (ASIC). When a particular sensing element 302 (i, j) in sensor array 300 is not selected by row selector 402, the sensing element 302 (i, j) is bypassed by switch 418, such that column circuitry 407 receives output from one sensing element 302 (i, j) at a time. Thus, for each scan of sensor array 300, row selector 402 and column circuitry 407 readout and process, in parallel, voltage outputs from one sensing element 302 in each column of sensor array 300.

In another embodiment, each column of sensor array 300 is multiplexed into a single shared column circuitry (e.g., using a multiplexer) that is coupled to all the columns of sensor array 300. In yet another embodiment, groups of two or more columns of sensor array 300 are multiplexed to two or more separate column circuitries. In an embodiment, sensor array 300 and column circuitry 407 can be included in separate integrated circuit (IC) chips or combined together into a single IC chip such as a system-on-chip (SoC).

In an embodiment, amplifier 406 can be a chopping-stabilized (auto-zero) amplifier with low offset and low drift that is timed by chopping clock 412. ADC 408 can be any suitable ADC, including but not limited to direct conversion, successive-approximation, integrating, sigma-delta, etc. ADC 408 can be timed by ADC clock 414, which can be a different clock that chopping clock 412, or derived from chopping clock 412 or another clock source. Both chopping clock 412 and the ADC clock 414 can be derived from a third clock (e.g., a system clock, master clock). Digital filter 410 can be any suitable low-pass filter design such as, for example, a first order finite impulse result (FIR) filter.

System 400 is operated in a calibration mode during manufacture or testing of an electronic system to determine a magnetic field gradient heat map for each of a plurality of magnetic aggressors internal to the electronic system. The calibration process is described in more detail in reference to FIG. 6. The result of the calibration process is magnetic field gradient heat map for each magnetic aggressor in the electronic system, which can be stored in cache memory (e.g., flash memory) of the electronic system. In an embodiment, the magnetic field gradient heat maps can be stored in a multi-dimensional array $\nabla_n$ (n, i, j), where n is the nth magnetic aggressor and the indexes i, j represent the position of an element of the two-dimensional magnetic field gradient heat map. The reconstructed magnetic field can also be stored in a multi-dimensional array B (n, i, j).

During normal operation, system 400 can be activated by a trigger event from, for example, a measurement controller, CPU or ASIC. For example, before sensor array 300 is scanned, a CPU can program selection logic 404 (e.g., program a command register in selection logic 404) to select a scan order. In a system with multiple sensor arrays 300, if the CPU knows which magnetic aggressors are active, the CPU can program selection logic 404 to select particular sensor arrays that will maximize detection of the EMI from the active magnetic aggressors to reduce power consumption due to scanning. In an embodiment, sensor array 300 can be readout on a scheduled basis (e.g., once for every x hours of operation of the electronic system) or during each start-up or initialization of the electronic system.

FIG. 4B is a schematic diagram of an example sensing element 302(i,j) of sensor array 300 shown in FIG. 4A, according to an embodiment. Sensing element 302(i,j) includes a magnetic field detector 416 coupled to switch 418. Switch 418 is commanded by row selection signal 420. Row selection signal 420 is generated by row selector 402, shown in FIG. 4A. Magnetic field detector 416 generates a voltage signal ($V_{OUT}$) that varies in response to a magnetic field. In an embodiment, magnetic field detector 416 is a Hall sensor. Because each sensing element 302(i,j) is integrated with switch 416, each sensing element 302 can be individual addressed by row selector 402, allowing for column parallel readout of sensor array 300.

Example Processes

Figure 5:
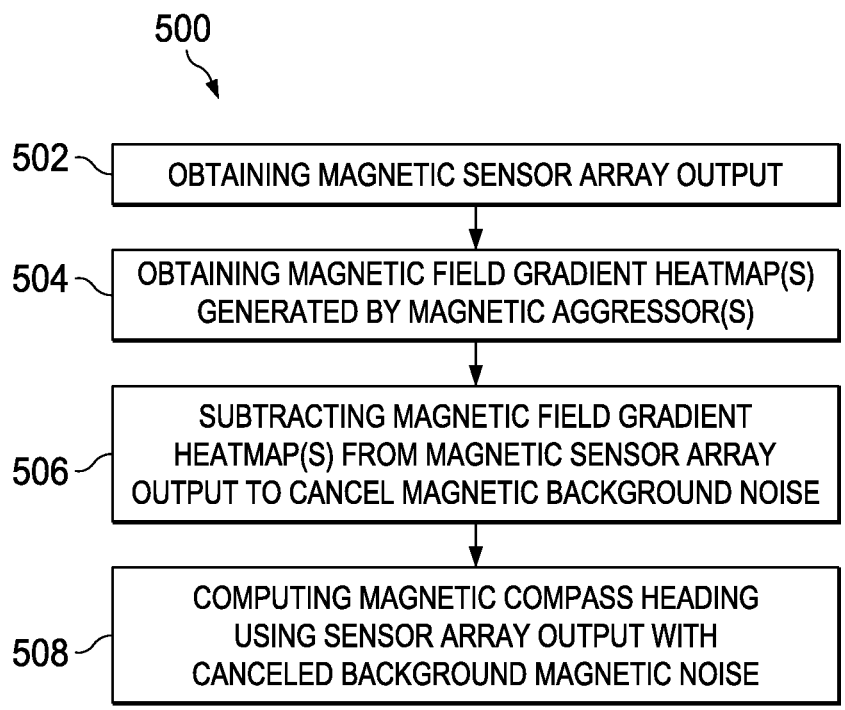
FIG. 5 is a flow diagram of an example process of cancelling magnetic interference using the magnetic sensor array of FIG. 4A, according to an embodiment.

FIG. 5 is a flow diagram of an example process 500 of cancelling magnetic interference using a sensor array, according to an embodiment. Process 500 can be implemented by, for example, the mobile device architecture 700 described in reference to FIG. 7.

Process 500 can begin by obtaining output from a magnetic sensor array (502). For example, system 400 described in reference to FIG. 4A can be used to obtain a voltage output from each sensing element 302 in sensor array 300.

Process 500 can continue by obtaining one or more magnetic field gradient heat maps for one or more magnetic aggressors (504). The one or more magnetic field gradient heat maps can be previously generated and stored during, for example, a calibration process 600 described in reference to FIG. 6. The one or more magnetic field gradient heat maps (e.g., one for each magnetic aggressor) can be stored in the electronic system (e.g., stored in flash memory).

Process 500 can continue by applying the one or more magnetic field gradient heat maps for one or more aggressors to sensor array output (506) to cancel the EMI generated by the one or more magnetic aggressors. For example, the magnetic field gradient heat map $\nabla_n(r_{i,j})$ for K magnetic aggressors can be subtracted from the output of the sensor array B (i, j) to obtain an accurate reading of earth's magnetic field $B_o$ using, for example, Equation [1]:

$$B(i,j) = B_o + \Sigma_{n=0}^{K} B_n \nabla_n (r_{i,j}). \quad [1]$$

where $r_{i,j}$ represents the distance between the nth magnetic aggressor and the sensing element.

When computing the sum in Equation [1], the magnitudes $B_n$ can be set to the appropriate values for magnetic aggressors that are active during readout of the sensor array and set to zero for magnetic aggressors that are not active during readout of the sensor array. For example, if magnetic aggressors 1 and 3 out of a total of 4 magnetic aggressors are simultaneously active during a scan of sensor array 300, $B_2$ and $B_4$ can be set to zero, such that only EMI contributions from active magnetic aggressors are included in the sum for the scan. Accordingly, Equation [1] allows for reconstruction of a magnetic field internal to an electronic system for any combination of magnetic aggressors that are active during a scan of sensor array 300. Before a scan of sensor array 300, a processor (e.g., CPU, ASIC) can determine which magnetic aggressors are active, and then obtain the corresponding magnetic field gradients from memory for use in Equation [1].

Figure 6:
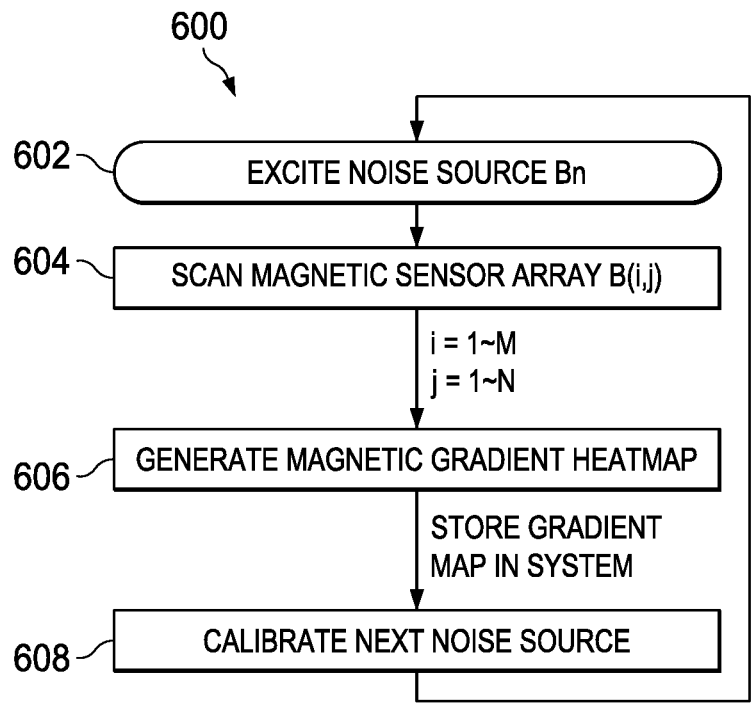
FIG. 6 is a flow diagram of an example process for generating magnetic field gradient heat maps for magnetic aggressors, according to an embodiment.

FIG. 6 is a flow diagram of an example process 600 for generating magnetic gradient heat maps for magnetic aggressors, according to an embodiment. Process 600 can be performed by an electronic system placed in a zero-gauss chamber.

Process 600 can begin by exciting a first magnetic aggressor $B_n$ of the electronic system (602). The magnetic aggressor can be, for example, a speaker coil, camera, CPU, haptic engine, battery, etc. Process 600 can continue by scanning (604) the outputs of each sensing element of the sensor array, and then generating a magnetic field gradient heat map (606) based on the scan results and storing the magnetic field gradient heat maps (608) in the electronic system (e.g., stored as vectors or arrays in cache memory).

In an embodiment, Equation [2] below can be used to calculate each element of a magnetic field gradient heat map for each magnetic aggressor:

$$\nabla_n(r_{i,j}) = \frac{B_{i,j} - B_o}{B_n}. \quad [2]$$

If the calibration is performed in a zero-gauss chamber, Equation [2] can be simplified by setting the term $B_o$ to zero. If calibration is performed during normal operation, a model of Earth's magnetic field and the current location of the electronic system can be used to estimate $B_o$.

Process 600 continues by repeating for the next magnetic aggressor the generating and storing of a magnetic field gradient in the electronic system. Process 600 can be performed during manufacture and testing and/or during normal operation of the electronic system in response to a triggered or scheduled event, such as after each power-up of the electronic system, after a predetermined number of scans of the sensor array, after detection of threshold error rate being exceeded, etc. The initiation of the calibration process 600 can be opportunistic, such as, for example, calibrating only at a time when only a single magnetic aggressor is active.

Example Device Architecture

Figure 7:
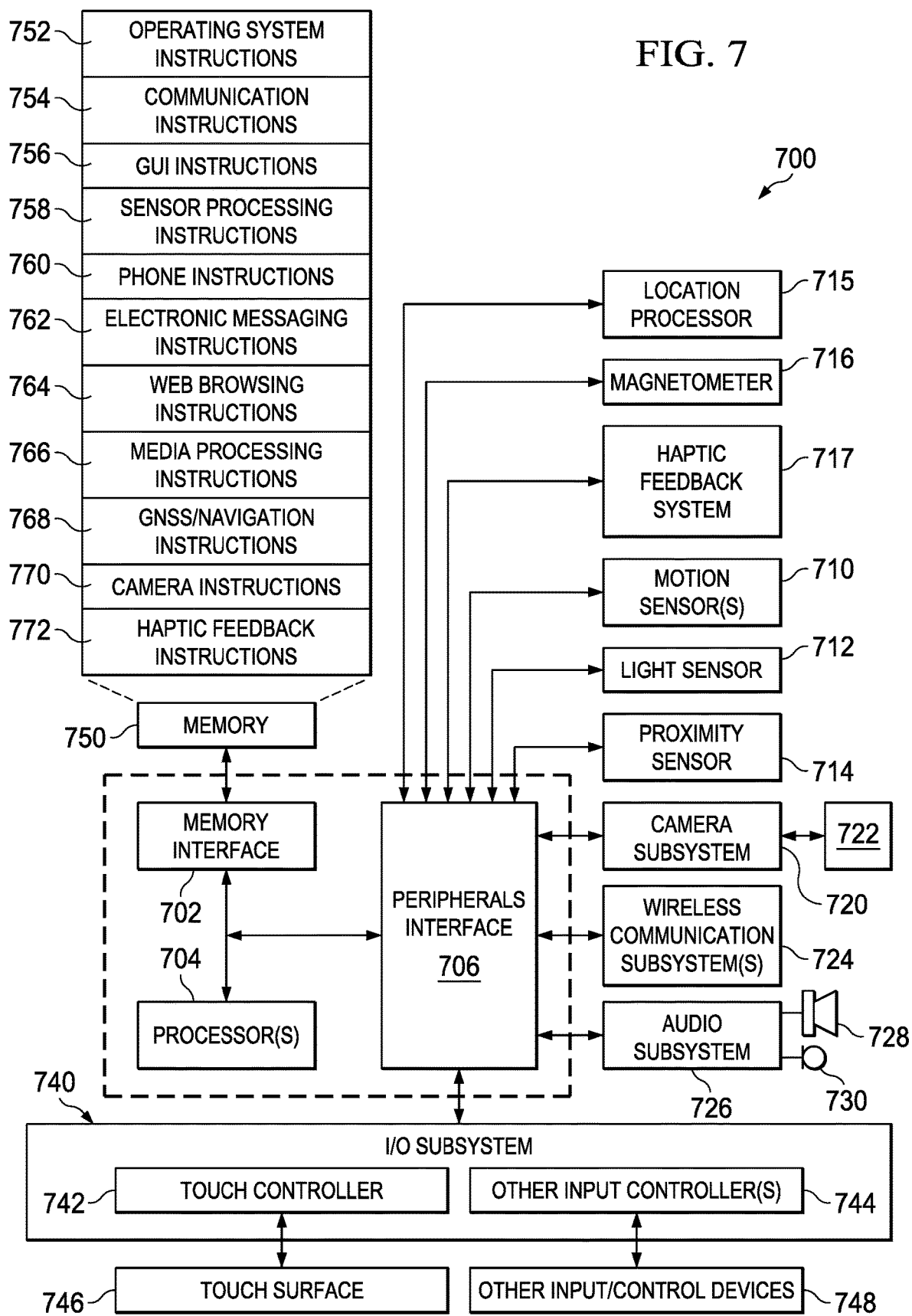
FIG. 7 is a diagram of an example mobile device architecture that uses a magnetic sensor array with noise cancellation, as described in reference to FIGS. 1-6, according to an embodiment.

FIG. 7 is a diagram of an example mobile device architecture that uses one of the haptic engines described in reference to FIGS. 1-6, according to an embodiment.

Architecture 700 may be implemented in any mobile device for generating the features and processes described in reference to FIGS. 1-6, including but not limited to smart phones and wearable computers (e.g., smart watches, fitness bands). Architecture 700 may include memory interface 702, data processor(s), image processor(s) or central processing unit(s) 704, and peripherals interface 706. Memory interface 702, processor(s) 704 or peripherals interface 706 may be separate components or may be integrated in one or more integrated circuits. One or more communication buses or signal lines may couple the various components.

Sensors, devices, and subsystems may be coupled to peripherals interface 706 to facilitate multiple functionalities. For example, motion sensor(s) 710, light sensor 712, and proximity sensor 714 may be coupled to peripherals interface 706 to facilitate orientation, lighting, and proximity functions of the device. For example, in some embodiments, light sensor 712 may be utilized to facilitate adjusting the brightness of touch surface 746. In some embodiments, motion sensor(s) 710 (e.g., an accelerometer, rate gyroscope) may be utilized to detect movement and orientation of the device. Accordingly, display objects or media may be presented according to a detected orientation (e.g., portrait or landscape).

Haptic engine 717, under the control of haptic engine instructions 772, provides the features and performs the processes described in reference to FIGS. 1-7, such as, for example, implementing haptic feedback (e.g., vibration). Haptic engine 717 can include one or more actuators, such as piezoelectric transducers, electromechanical devices, and/ or other vibration inducing devices, that are mechanically connected to an input surface (e.g., touch surface 746). Drive electronics coupled to the one or more actuators cause the actuators to induce a vibratory response into the input surface, providing a tactile sensation to a user touching or holding the device.

Other sensors may also be connected to peripherals interface 706, such as a temperature sensor, a barometer, a biometric sensor, or other sensing device, to facilitate related functionalities. For example, a biometric sensor can detect fingerprints and monitor heart rate and other fitness parameters. In some implementations, a Hall sensing element in haptic engine 717 can be used as a temperature sensor.

Location processor 715 (e.g., GNSS receiver chip) may be connected to peripherals interface 706 to provide geo-referencing. Electronic magnetometer 716 (e.g., an integrated circuit chip) may also be connected to peripherals interface 706 to provide data that may be used to determine the direction of magnetic North. Thus, electronic magnetometer 716 may be used to support an electronic compass application.

Camera subsystem 720 and an optical sensor 722, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 724. Communication subsystem(s) 724 may include one or more wireless communication subsystems. Wireless communication subsystems 724 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and embodiment of the communication subsystem 724 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 724 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 726 may be coupled to a speaker 728 and one or more microphones 730 to facilitate voice-enabled functions, such as voice recognition, voice replication, digital recording, and telephony functions. In an embodiment, audio subsystem includes a digital signal processor (DSP) that performs audio processing, such as implementing codecs.

I/O subsystem 740 may include touch controller 742 and/or other input controller(s) 744. Touch controller 742 may be coupled to a touch surface 746. Touch surface 746 and touch controller 742 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 746. In one embodiment, touch surface 746 may display virtual or soft buttons and a virtual keyboard, which may be used as an input/output device by the user.

Other input controller(s) 744 may be coupled to other input/control devices 748, such as one or more buttons, rocker switches, thumb-wheel, infrared port, USB port, and/or a pointer device such as a stylus. The one or more buttons (not shown) may include an up/down button for volume control of speaker 728 and/or microphone 730.

In some embodiments, device 700 may present recorded audio and/or video files, such as MP3, AAC, and MPEG video files. In some embodiments, device 700 may include the functionality of an MP3 player and may include a pin connector for tethering to other devices. Other input/output and control devices may be used.

Memory interface 702 may be coupled to memory 750. Memory 750 may include high-speed random access memory or non-volatile memory, such as one or more magnetic disk storage devices, one or more optical storage devices, or flash memory (e.g., NAND, NOR). Memory 750 may store operating system 752, such as Darwin, RTXC, LINUX, UNIX, OS X, iOS, WINDOWS, or an embedded operating system such as VxWorks. Operating system 752 may include instructions for handling basic system services and for performing hardware dependent tasks. In some embodiments, operating system 752 may include a kernel (e.g., UNIX kernel).

Memory 750 may also store communication instructions 754 to facilitate communicating with one or more additional devices, one or more computers or servers, including peer-to-peer communications. Communication instructions 754 may also be used to select an operational mode or communication medium for use by the device, based on a geographic location (obtained by the GPS/Navigation instructions 768) of the device.

Memory 750 may include graphical user interface instructions 756 to facilitate graphic user interface processing, including a touch model for interpreting touch inputs and gestures; sensor processing instructions 758 to facilitate sensor-related processing and functions; phone instructions 760 to facilitate phone-related processes and functions; electronic messaging instructions 762 to facilitate electronic-messaging related processes and functions; web browsing instructions 764 to facilitate web browsing-related processes and functions; media processing instructions 766 to facilitate media processing-related processes and functions; GNSS/Navigation instructions 768 to facilitate GNSS (e.g., GPS, GLOSSNAS) and navigation-related processes and functions; camera instructions 770 to facilitate camera-related processes and functions; and haptic engine instructions 772 for commanding or controlling haptic engine 717 and to provide the features and performing the processes described in reference to FIGS. 1-6.

Each of the above identified instructions and applications may correspond to a set of instructions for performing one or more functions described above. These instructions need not be implemented as separate software programs, procedures, or modules. Memory 750 may include additional instructions or fewer instructions. Furthermore, various functions of the device may be implemented in hardware and/or in software, including in one or more signal processing and/or application specific integrated circuits (ASICs).

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A circuit comprising:
   a first circuit configured for obtaining an output signal from an M×N magnetic field sensor array in an electronic system, the output signal representing a magnetic field internal to the electronic system, wherein M and N are positive integers greater than one and the first circuit is configured to individually address each sensing element in the M×N magnetic field sensor array for readout;
   a second circuit configured to:
      determining whether or not a magnetic aggressor is active in the electronic system;
      in accordance with the magnetic aggressor being active in the electronic system,
         retrieve, from storage, a magnetic field gradient for the magnetic aggressor from a plurality of magnetic field gradients for a plurality of magnetic aggressors located at different locations in the electronic system, the magnetic field gradient including a measurement of the magnetic field internal to the electronic system that was measured in the past when the magnetic aggressor was active; and
         subtracting the magnetic field in the magnetic field gradient from the output signal to cancel electromagnetic interference (EMI) contributions to the output signal generated by the magnetic aggressor.

2. The circuit of claim 1, wherein the second circuit further comprises:
   a storage device storing the one or more magnetic field gradients.

3. The circuit of claim 1, wherein the output signal is generated by a Hall sensor in the magnetic field sensor array.

4. The circuit of claim 1, wherein the first circuit further comprises:
   row selection circuitry configured to individually address one of the plurality of sensing elements in the magnetic field sensor array for readout of the output signal.

5. The circuit of claim 4, wherein the output signal is a voltage output signal and each of the plurality of the sensing elements in the magnetic field sensor array includes a switch that can be activated by a selection signal to provide the voltage output signal.

6. The circuit of claim 4, wherein the first circuit includes column circuitry coupled to one or more columns of the magnetic sensor array, the column circuitry comprising:
   an amplifier configured to amplify the output signal;
   an analog-to-digital converter (ADC) coupled to the amplifier and configured to convert the amplified output signal to one or more digital values; and
   a digital filter coupled the ADC and configured to filter the one or more digital values.

7. The circuit of claim 6, wherein the amplifier is a chopping stabilized or auto-zero amplifier.

8. The circuit of claim 6, wherein the digital filter is a digital low-pass filter.

9. A method comprising:
   obtaining, by a first circuit of an electronic system, an output signal from an M×N magnetic field sensor array in the electronic system, the output signal representing a magnetic field internal to the electronic system, where M and N are positive integer values greater than one, and the first circuit is configured to individually address each sensing element of the M×N magnetic field sensor array for readout;

determining, by a second circuit of the electronic system, whether or not a magnetic aggressor is active in the electronic system;

in accordance with the magnetic aggressor being active in the electronic system, retrieving, from storage, a magnetic field gradient for the magnetic aggressor from a plurality of magnetic field gradients for a plurality of magnetic aggressors located at different locations in the electronic system, the magnetic field gradient including a measurement of the magnetic field internal to the electronic system that was measured in the past when the magnetic aggressor was active; and subtracting the magnetic field in the magnetic field gradient from the output signal to cancel electromagnetic interference (EMI) contributions to the output signal generated by the magnetic aggressor.

10. The method of claim 9, further comprising:

amplifying, by an amplifier, the output signal;

converting, by an analog-to-digital converter (ADC) converter, the amplified output signal to one or more digital values; and filtering, by a digital filter, the one or more digital values.

11. An electronic system comprising:

an M×N magnetic field sensor array, where M and N are positive integer values greater than one;

selection circuitry coupled to the magnetic field sensor array;

processing circuitry coupled to the selection circuitry;

a storage device configured for storing calibrated magnetic field gradients generated by a plurality of magnetic aggressors located at different locations in the electronic system;

one or more processors;

memory storing instructions, that when executed by the one or more processors, cause the one or more processors to perform operations comprising:

obtaining, by the selection circuitry, an output signal from the magnetic field sensor array in the electronic system, the output signal representing a magnetic field present in the electronic system, wherein the selection circuitry is configured to individually address each sensing element of the M×N magnetic field sensor array for readout;

determining, by the processing circuitry of the electronic system, whether or not a magnetic aggressor is active in the electronic system;

in accordance with the magnetic aggressor being active in the electronic system, retrieving, from the storage device, a magnetic field gradient for the magnetic aggressor, the magnetic field gradient including a measurement of the magnetic field internal to the electronic system that was measured in the past when the magnetic aggressor was active; and subtracting the magnetic field in the magnetic field gradient from the output signal to cancel electromagnetic interference (EMI) contributions to the output signal generated by the magnetic aggressor.

12. The electronic system of claim 11, wherein the magnetic field sensor array has rows and columns, and wherein the selection circuitry includes row circuitry for individually selecting a row of the magnetic field sensor array for column parallel readout of the output signal.

13. The electronic system of claim 11, further comprising:

a display device including a layer, the layer including the magnetic field sensor array.

14. The electronic system of claim 11, further comprising:

column circuitry coupled to a column of the magnetic field sensor array, the column circuitry comprising:

an amplifier configured to amplify the output signal;

an analog-to-digital converter (ADC) coupled to the amplifier and configured to convert the amplified output signal to one or more digital values; and a digital filter coupled the ADC and configured to filter the digital values.

15. The electronic system of claim 14, wherein the amplifier is a chopping stabilized or auto-zero amplifier.

16. The electronic system of claim 14, wherein the digital filter is a digital low-pass filter.

17. A non-transitory, computer-readable storage medium having stored thereon instructions, that when executed by one or more processors of an electronic system, causes the one or more processors to perform operations comprising:

obtaining, by a first circuit of the electronic system, an output signal from an M×N magnetic field sensor array in the electronic system, the output signal representing a magnetic field present in the electronic system, where M and N are positive integer values greater than one, and the first circuit is configured to individually address each sensing element of the M×N magnetic field sensor array for readout;

determining, by a second circuit of the electronic system, whether or not a magnetic aggressor is active in the electronic system;

in accordance with the magnetic aggressor being active in the electronic system, retrieving, from storage, a magnetic field gradient for the magnetic aggressor from a plurality of magnetic field gradients for a plurality of magnetic aggressors located at different locations in the electronic system, the magnetic field gradient including a measurement of the magnetic field internal to the electronic system that was measured in the past when the magnetic aggressor was active; and subtracting the magnetic field in the magnetic field gradient from the output signal to cancel electromagnetic interference (EMI) contributions to the output signal generated by the magnetic aggressor, wherein the magnetic field sensor array includes an M by N grid of the sensing elements, where M and N are positive integer values greater than zero, and the first circuit is configured to individually address each sensing element for readout.

* * * * *